(12) United States Patent
Collins

(10) Patent No.: US 7,148,668 B1
(45) Date of Patent: Dec. 12, 2006

(54) COMPLETELY ISOLATED SYNCHRONOUS BOOST DC-TO-DC SWITCHING REGULATOR

(75) Inventor: Michael John Collins, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 260 days.

(21) Appl. No.: 10/834,551

(22) Filed: Apr. 28, 2004

(51) Int. Cl.
  *G05F 1/56* (2006.01)
(52) U.S. Cl. .................................... 323/282
(58) Field of Classification Search ............. 323/282, 323/283, 284, 285, 351
  See application file for complete search history.

(56) References Cited

U.S. PATENT DOCUMENTS 6,008,689 A * 12/1999 Au et al. .................... 327/534
6,621,256 B1 * 9/2003 Muratov et al. ............ 323/282

OTHER PUBLICATIONS

Toko Inc., TK65600B Datasheet, "Inductive White LED Driver With Synchronous Rectifier", Jul. 2, 2003, pp. 1-12.
Toko Inc., TK65700L Datasheet, "Charge Pump White LED Driver", Jul. 12, 2002, pp. 1-10.
U.S. Appl. No. 10/454,882, filed Jun. 5, 2003, Doyle.

* cited by examiner

*Primary Examiner*—Adolf Berhane
(74) *Attorney, Agent, or Firm*—Mark C. Pickering

(57) ABSTRACT

The leakage current due to a parasitic PNP bipolar transistor in the PMOS switching transistor of a synchronous boost DC-to-DC switching regulator is substantially eliminated by placing the input voltage on the body of the PMOS switching transistor when the input voltage is greater than the output voltage, and placing the output voltage on the body of the PMOS switching transistor when the input voltage is less than the output voltage.

23 Claims, 2 Drawing Sheets

COMPLETELY ISOLATED SYNCHRONOUS BOOST DC-TO-DC SWITCHING REGULATOR

BACKGROUND OF THE INVENTION

1. Field of the Invention

The present invention relates to switching regulators and, more particularly, to a completely isolated synchronous boost DC-to-DC switching regulator.

2. Description of the Related Art

A boost DC-to-DC switching regulator is a device that provides a DC output voltage on an output node that is higher than the DC input voltage on the input node by switching the output of an inductor between ground and a diode connected to the output node. A synchronous boost DC-to-DC switching regulator utilizes a pair of switches, such as an NMOS transistor and a PMOS transistor, to switch between ground and the output node.

FIG. 1 shows a schematic diagram that illustrates a prior-art, synchronous boost DC-to-DC switching regulator 100. As shown in FIG. 1, switching regulator 100 includes an input node $N_{IN}$ that receives a DC input voltage $V_{IN}$, an input capacitor $C_{IN}$ that has a first plate connected to the input node $N_{IN}$ and a second plate connected to ground, and an inductor L that has a first end connected to the input node $N_{IN}$, and a second end connected to a switch node $N_{SW}$.

Switching regulator 100 also includes an NMOS transistor M1 and a PMOS transistor M2. NMOS transistor M1 has a drain connected to the switch node $N_{SW}$, a source coupled to ground, and a gate connected to receive a first drive signal Ndrive. PMOS transistor M2, in turn, has a drain connected to the switch node $N_{SW}$, a source connected to an output node $N_{OUT}$, and a gate connected to receive a second drive signal Pdrive. Further, the p+ drain and source of PMOS transistor M2 are formed in an n– body 110 that is electrically connected to an output voltage $V_{OUT}$ on the output node $N_{OUT}$.

In addition, switching regulator 100 includes an output capacitor $C_{OUT}$ that has a first plate connected to the output node $N_{OUT}$, and a second plate connected to ground. Further, a load 112 is connected between the output node $N_{OUT}$ and a feedback node $N_{FB}$, which is coupled to ground via a resistor R1. Examples of loads include one or more resistors (which set a fixed output voltage) and a series of white light emitting diodes (LEDs).

Switching regulator 100 also includes a control circuit 114 that is connected to the gate of transistor M1 to output the first drive signal Ndrive, the gate of transistor M2 to output the second drive signal Pdrive, and the feedback node $N_{FB}$ to receive a feedback voltage $V_{FB}$. Control circuit 114 can be implemented as a pulse width modulation (PWM) controller, a pulse frequency modulation (PFM) controller, a burst mode controller, or any other means of regulating a voltage using 2 synchronous switches and an inductor and capacitor.

In operation, assuming the output voltage $V_{OUT}$ equals the input voltage $V_{IN}$, control circuit 114 turns on NMOS transistor M1 and turns off PMOS transistor M2. When transistor M1 turns on, ground is placed on the second end of inductor L which, in turn, causes a current (that changes with time) to flow through inductor L and NMOS transistor M1 to ground.

The current increases at a rate of $V_{IN}/L$. The voltage at the switch node $N_{SW}$ is equal to the resistance of the NMOS transistor M1 multiplied times the inductor current. The voltage does not increase to $V_{IN}$. When transistor M1 is on, the voltage on the switch node $N_{SW}$ is low (Rdson*the inductor current).

After this, control circuit 114 turns off NMOS transistor M1 and turns on PMOS transistor M2. Transistor M1 is turned off by either a current limit, duty cycle maximum, or a fixed time if using a fixed on-time PFM type control loop. The current flowing in an inductor cannot change value instantaneously.

As a result, a current flows through PMOS transistor M2 to output capacitor $C_{OUT}$ and load 112, where the current charges up the output voltage $V_{OUT}$ on output capacitor $C_{OUT}$ to a magnitude that is greater than the magnitude of the input voltage $V_{IN}$. In addition, since transistor M2 is on, the voltage on the switch node $N_{SW}$ is approximately $V_{OUT}$.

Following this, control circuit 114 again turns on NMOS transistor M1 and turns off PMOS transistor M2. Transistor M2 is turned off by either a current limit, duty cycle maximum, or a fixed time if using a fixed on-time PFM type control loop. When NMOS transistor M1 turns on, the voltage on switch node $N_{SW}$ again drops to ground (the switch node $N_{SW}$ switches between ground (M1 on) and $V_{OUT}$ (M2 on). When PMOS transistor M2 turns off, output capacitor $C_{OUT}$ discharges, thereby providing the current to load 112.

Control circuit 114 then continues, alternating between turning on PMOS transistor M2 and NMOS transistor M1. In addition, control circuit 114 receives the feedback voltage $V_{FB}$ from the feedback node $N_{FB}$ and, in response to the feedback voltage $V_{FB}$ (along with any other additional sensed lines), adjusts the period of time that NMOS and PMOS transistors M1 and M2 are turned on to insure that a substantially constant current is sourced to load 112. (For voltage mode PWM control, only the feedback voltage $V_{FB}$ is needed for regulation. However, for current mode PWM control, both the feedback voltage $V_{FB}$ and a sensed inductor current are needed.)

One drawback of switching regulator 100 is that switching regulator 100 operates poorly (is leaky) when in shutdown mode. Switching regulator 100 has two modes of operation: a shutdown mode where the input voltage $V_{IN}$ is greater than the output voltage $V_{OUT}$; and a normal mode where the output voltage $V_{OUT}$ is greater than the input voltage $V_{IN}$.

FIG. 2 shows a cross-sectional view that illustrates prior-art PMOS transistor M2 of switching regulator 100. As shown in FIG. 2, a parasitic PNP bipolar transistor Q1 is formed from transistor M2, where the drain of transistor M2 functions as the emitter, the source of transistor M2 functions as the collector, and the body functions as the base, providing base resistance R2, which is connected to the output voltage $V_{OUT}$.

As shown in FIG. 2, whenever the voltage on the switch node $N_{SW}$ is a junction drop, e.g., 0.7V, greater than the output voltage $V_{OUT}$, the emitter-base junction forward biases, which then turns on parasitic PNP bipolar transistor Q1. As a result, a leakage current flows through PMOS transistor M2 when switching regulator 100 enters the shutdown mode (when $V_{IN}$ is greater than $V_{OUT}$).

In addition to wasting power, the leakage current can also drain a battery when the input node $N_{IN}$ is connected to the battery. Thus, there is a need for a synchronous boost DC-to-DC switching regulator that eliminates the parasitic PNP transistor, and thereby eliminates the leakage current through PMOS transistor M2 when switching regulator 100 enters the shutdown mode (when $V_{IN}$ is greater than $V_{OUT}$).

DETAILED DESCRIPTION OF THE INVENTION

Figure 1:
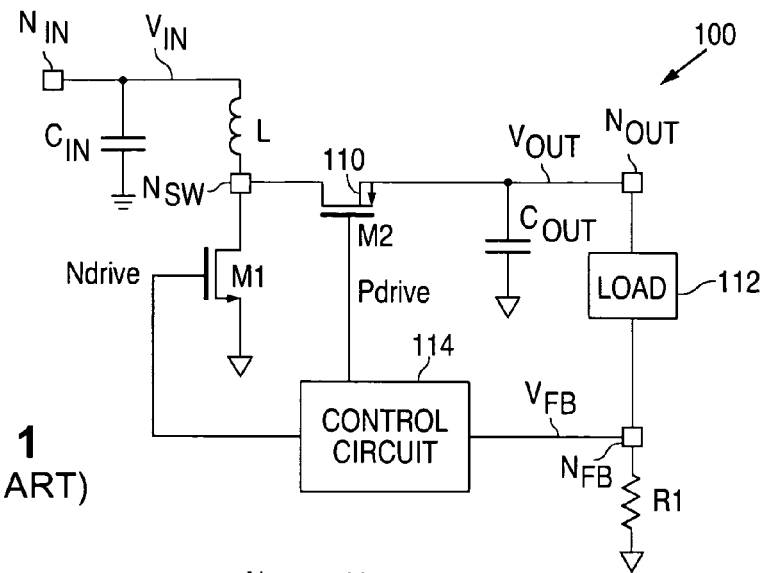
FIG. 1 is a schematic diagram illustrating a prior-art, synchronous boost DC-to-DC switching regulator 100.
Figure 2:
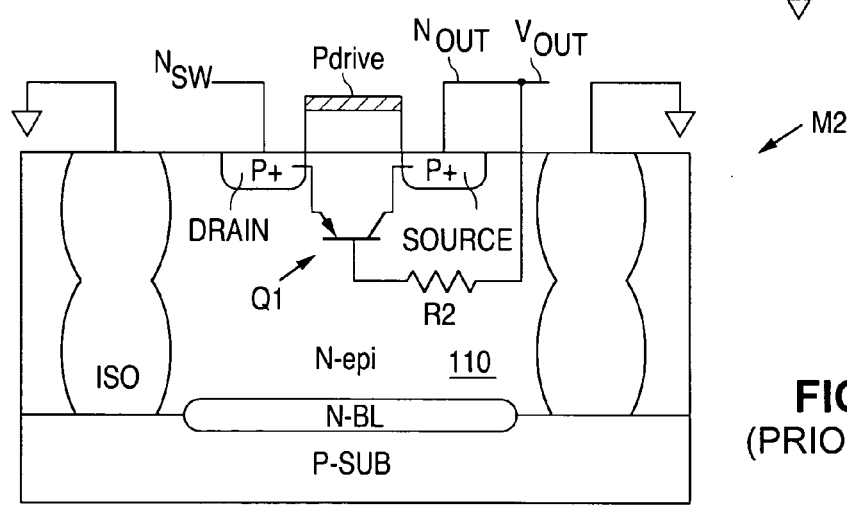
FIG. 2 is a cross-sectional view illustrating prior-art PMOS transistor M2 of switching regulator 100.
Figure 3:
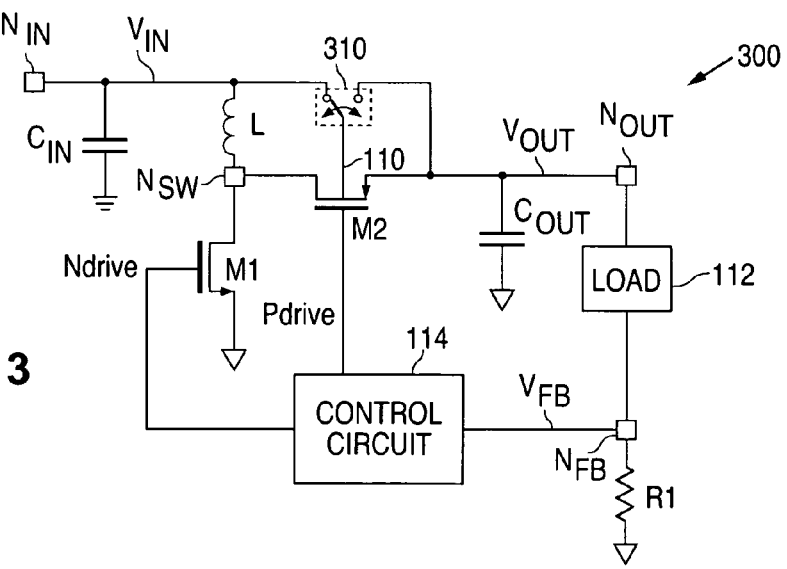
FIG. 3 is a schematic diagram illustrating an example of a completely isolated synchronous boost DC-to-DC switching regulator 300 in accordance with the present invention.

FIG. 3 shows a schematic diagram that illustrates an example of a completely isolated synchronous boost DC-to-DC switching regulator 300 in accordance with the present invention. As described in greater detail below, the present invention substantially eliminates the parasitic PNP bipolar transistor by changing the voltage applied to the body depending on the mode of operation of switching regulator 300.

Switching regulator 300 is similar to switching regulator 100 and, as a result, utilizes the same reference numerals to designate the structures which are common to both regulators. As shown in FIG. 3, switching regulator 300 differs from switching regulator 100 in that regulator 300 has a body switch circuit 310 that electrically connects n− body 110 to the input voltage $V_{IN}$ when switching regulator 300 operates in the shutdown mode ($V_{IN}$ is greater than $V_{OUT}$), and to the output voltage $V_{OUT}$ when switching regulator 300 operates in the normal mode ($V_{OUT}$ is greater than $V_{IN}$). When switched in this manner, switching regulator 300 substantially eliminates the parasitic PNP bipolar transistor and the associated leakage current.

Figure 4:
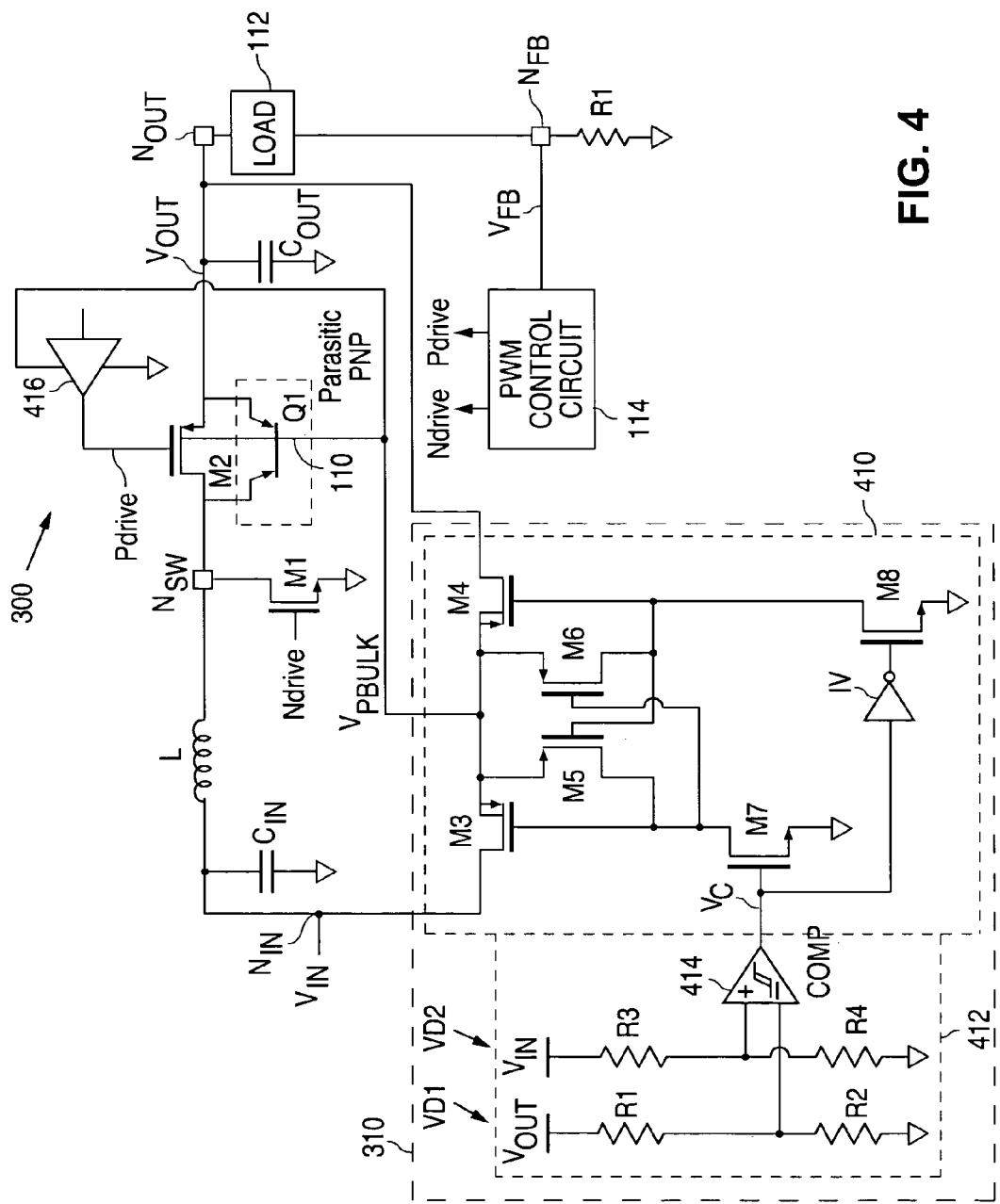
FIG. 4 is a schematic diagram further illustrating an example of body switch circuit 310 of synchronous boost DC-to-DC switching regulator 300 in accordance with the present invention.

FIG. 4 shows a schematic diagram that further illustrates an example of body switch circuit 310 of synchronous boost DC-to-DC switching regulator 300 in accordance with the present invention. As shown in the FIG. 4, body switch circuit 310 can include a logic circuit 410 that outputs a bulk voltage $V_{PBULK}$ to n− region 110 that substantially equals the input voltage $V_{IN}$ or the output voltage $V_{OUT}$, depending on whether the input voltage $V_{IN}$ or the output voltage $V_{OUT}$ is larger.

Logic circuit 410, in turn, includes a PMOS transistor M3 that switchably passes the input voltage $V_{IN}$ as the bulk voltage $V_{PBULK}$ to n− body 110. PMOS transistor M3 has a drain that is connected to the input voltage $V_{IN}$, a source and a body that are connected to n− body 110, and a gate.

In addition, logic circuit 410 also includes a PMOS transistor M4 that switchably passes the output voltage $V_{OUT}$ as the bulk voltage $V_{PBULK}$ to n− body 110. PMOS transistor M4 has a drain that is connected to the output voltage $V_{OUT}$, a source and a body that are connected to n− body 110, and a gate.

Logic circuit 410 can also include a PMOS transistor M5 and a PMOS transistor M6 that function as a latch. PMOS transistor M5 has a drain that is connected to the gate of transistor M3, a source that is connected to n− body 110, and a gate that is connected to the gate of transistor M4. PMOS transistor M6 has a drain that is connected to the gate of transistor M4, a source that is connected to n− body 110, and a gate that is connected to the gate of transistor M3.

In addition, logic circuit 410 can include an inverter IV, an NMOS transistor M7 and an NMOS transistor M8. NMOS transistor M7 has a drain that is connected to the gate of transistor M3, a source that is connected to ground, and a gate that is connected to the input of inverter IV. NMOS transistor M8 has a drain that is connected to the gate of transistor M4, a source that is connected to ground, and a gate that is connected to the output of inverter IV.

In addition to logic circuit 410, body switch circuit 310 can include a comparing circuit 412 that outputs a comparison signal $V_C$ that indicates whether the input voltage $V_{IN}$ or the output voltage $V_{OUT}$ is greater in response to a scaled version of the input voltage $V_{IN}$, and a scaled version of the output voltage $V_{OUT}$.

Comparing circuit 412 can include a comparator 414, a first voltage divider VD1, and a second voltage divider VD2. Comparator 414 has a positive input, a negative input, and an output that is connected to the gate of NMOS transistor M7. Voltage divider VD1 includes a first resistor R1 that has a first end connected to the output voltage $V_{OUT}$ and a second end connected to the negative input, and a second resistor R2 that has a first end connected to the negative input and a second end connected to ground.

Voltage divider VD2 includes a third resistor R3 that has a first end connected to the input voltage $V_{IN}$ and a second end connected to the positive input, and a fourth resistor R4 that has a first end connected to the positive input and a second end connected to ground. In addition, in this example, resistors R1, R2, R3, and R4 have substantially equal resistance values.

Transistors M3–M8 can also be cascaded to accommodate high output voltage to input voltage ratios $V_{OUT}/V_{IN}$. Further, a driver 416 (previously part of control circuit 114) is electrically connected to both the gate of PMOS transistor M2 and n− body 110 to receive the bulk voltage $V_{PBULK}$. This insures that driver 416 can control PMOS transistor M2 under both $V_{IN}$ and $V_{OUT}$ rails. All circuitry in this example is internal to the device except inductor L, capacitors $C_{IN}$ and $C_{OUT}$, and load 112 (resistors can alternately be internally included). The maximum output voltage $V_{OUT}$ and the maximum input voltage $V_{IN}$ are limited to the breakdown voltages of the process used.

In operation, when the output voltage $V_{OUT}$ is greater than the input voltage $V_{IN}$, comparator 414 outputs a logic low that turns off NMOS transistor M7 and, via inverter IV, turns on NMOS transistor M8. When transistor M8 turns on, transistor M8 pulls the voltage on the gate of transistors M4 and M5 down to ground, thereby turning on transistors M4 and M5.

When transistor M4 turns on, transistor M4 passes the output voltage $V_{OUT}$ as the body voltage $V_{PBULK}$ to n− body 110. When transistor M5 turns on, transistor M5 places the output voltage $V_{OUT}$ on the gates of transistors M3 and M6 which, in turn, turns off transistors M3 and M6. Thus, transistor M4 passes the output voltage $V_{OUT}$ as the body voltage $V_{PBULK}$ on n− body 110 when switching regulator 300 operates in the normal mode. In this condition, substantially no leakage current exists from the parasitic PNP bipolar transistor.

On the other hand, when the input voltage $V_{IN}$ is greater than the output voltage $V_{OUT}$, comparator 414 outputs a logic high that turns on NMOS transistor M7 and, via inverter IV, turns off NMOS transistor M8. When transistor M7 turns on, transistor M7 pulls the voltage on the gate of transistors M3 and M6 down to ground, thereby turning on transistors M3 and M6.

When transistor M3 turns on, transistor M3 passes the input voltage $V_{IN}$ as the body voltage $V_{PBULK}$ to n– body 110. When transistor M6 turns on, transistor M6 places the input voltage $V_{IN}$ on the gates of transistors M4 and M5 which, in turn, turns off transistors M4 and M5. Thus, transistor M3 passes the input voltage $V_{IN}$ as the body voltage $V_{PBULK}$ to n– body 110 when switching regulator 300 operates in the shutdown mode. In this condition, substantially no leakage current exists from the parasitic PNP bipolar transistor.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A switching regulator comprising:
   a switch node;
   a first transistor continuously connected to the switch node and a ground node;
   a second transistor connected to the switch node and an output node that has an output voltage, the second transistor having a source of a first conductivity type formed in a body of a second conductivity type, a spaced-apart drain of the first conductivity type formed in the body, and a gate;
   a capacitor connected to the output node and ground; and
   a body switch circuit that connects the body to an input voltage when the switching regulator operates in a shutdown mode where the input voltage is greater than the output voltage, or to the output voltage when the switching regulator operates in a normal mode where the output voltage is greater than the input voltage.

2. A switching regulator comprising:
   a switch node;
   a first transistor connected to the switch node and ground;
   a second transistor connected to the switch node and an output node that has an output voltage, the second transistor having a source of a first conductivity type formed in a body of a second conductivity type, a spaced-apart drain of the first conductivity type formed in the body, and a gate;
   a capacitor connected to the output node and ground; and
   a body switch circuit that connects the body to an input voltage when the switching regulator operates in a shutdown mode where the input voltage is greater than the output voltage, or to the output voltage when the switching regulator operates in a normal mode where the output voltage is greater than the input voltage, the body switch circuit including a logic circuit that places the input voltage on the body when a comparing signal has a first logic state, and the output voltage on the body when the comparing signal has a second logic state, the comparing signal indicating whether the input voltage or the output voltage is greater.

3. The switching regulator of claim 2 and further comprising an inductor that has a first end connected to the switch node and a second end connected to an input node that has the input voltage, the inductor having a plurality of coils.

4. The switching regulator of claim 2 wherein the logic circuit includes:
   a third transistor electrically connected to the input node and the body; and
   a fourth transistor electrically connected to the output node and the body.

5. The switching regulator of claim 4 and further comprising an inductor that has a first end connected to the switch node, and a second end connected to the input node that has the input voltage, the inductor having a plurality of coils.

6. The switching regulator of claim 4 wherein the logic circuit further includes:
   a fifth transistor electrically connected to the third transistor, ground, and the comparator; and
   a sixth transistor electrically coupled to the fourth transistor, ground, and the comparator.

7. The switching regulator of claim 6 wherein the sixth transistor is electrically coupled to the comparing circuit via an inverter.

8. The switching regulator of claim 7 and further comprising an inductor that has a first end connected to the switch node, and a second end connected to the input node that has the input voltage, the inductor having a plurality of coils.

9. The switching regulator of claim 6 wherein the logic circuit additionally includes:
   a seventh transistor electrically connected to the third, fourth, fifth, and sixth transistors; and
   an eighth transistor electrically coupled to the third, fourth, fifth, and sixth transistors.

10. The switching regulator of claim 9 and further comprising an inductor that has a first end connected to the switch node, and a second end connected to the input node that has the input voltage, the inductor having a plurality of coils.

11. The switching regulator of claim 2 wherein the body switch circuit further includes a comparing circuit that outputs the comparing signal with a first logic state when an input voltage is greater than an output voltage on the output node, and a second logic state when the input voltage is less than the output voltage.

12. The switching regulator of claim 11 wherein the comparing circuit includes a comparator that has a positive input, a negative input, and an output that outputs the comparing signal.

13. The switching regulator of claim 12 wherein the comparing circuit further includes:
   a first voltage divider connected to the output voltage and the comparator; and
   a second voltage divider connected to the input voltage and the comparator.

14. The switching regulator of claim 13 wherein:
   first voltage divider includes a first resistor that has a first end connected to the output voltage and a second end connected to the negative input, and a second resistor that has a first end connected to the negative input and a second end connected to ground; and
   the second voltage divider includes a third resistor that has a first end connected to the input voltage and a second end connected to the positive input, and a fourth resistor that has a first end connected to the positive input and a second end connected to ground.

15. The switching regulator of claim 14 wherein the first, second, third, and fourth resistors have substantially equal values.

16. The switching regulator of claim 11 wherein logic circuit includes:
   a third transistor electrically connected to the input node and the body; and a fourth transistor electrically connected to the output node and the body.

17. The switching regulator of claim 16 wherein the logic circuit further includes:
a fifth transistor electrically connected to the third transistor, ground, and the comparator; and
a sixth transistor electrically coupled to the fourth transistor, ground, and the comparator.

18. The switching regulator of claim 17 wherein the sixth transistor is electrically coupled to the comparing circuit via an inverter.

19. The switching regulator of claim 18 and further comprising an inductor that has a first end connected to the switch node, and a second end connected to the input node that has the input voltage, the inductor having a plurality of coils.

20. A switching regulator comprising:
a first transistor having a first drain connected to a first node, a first source connected to a second node, and a first gate, the first drain and first source contacting a body region of an opposite conductivity type;
a second transistor having a second drain connected to the first drain, a second source, and a second gate;
a comparison circuit having a first input connected to a third node, a second input connected to the second node, and an output that indicates whether a voltage on the second node is greater than a voltage on the third node; and
a switch circuit having a first input connected to the third node, a second input connected to the second node, a third input connected to the output of the comparison circuit, and an output connected to the body region.

21. The switching regulator of claim 20 wherein when the voltage on the second node is greater than the voltage on the third node, a voltage approximately equal to the voltage on the second node is output from the switch circuit to the body region, and when the voltage on the third node is greater than the voltage on the second node, a voltage approximately equal to the voltage on the third node is output from the switch circuit to the body region.

22. The switching regulator of claim 21 wherein the output of the switch circuit is electrically connected to the first gate of the first transistor.

23. The switching regulator of claim 22 and further comprising an inductor connected to the first node and the third node.

* * * * *